(12) United States Patent
Tsai et al.

(10) Patent No.: US 12,740,474 B2
(45) Date of Patent: Sep. 15, 2026

(54) ELECTRONIC DEVICE AND MANUFACTURING METHOD OF THE SAME

(71) Applicant: Innolux Corporation, Miaoli County (TW)

(72) Inventors: Ming-Chih Tsai, Miaoli County (TW); Chen-Yu Lin, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 365 days.

(21) Appl. No.: 18/534,753

(22) Filed: Dec. 11, 2023

(65) Prior Publication Data

US 2024/0243028 A1 Jul. 18, 2024

Related U.S. Application Data

(60) Provisional application No. 63/438,534, filed on Jan. 12, 2023.

(30) Foreign Application Priority Data

Aug. 28, 2023 (CN) ........................ 202311090459.0

(51) Int. Cl.

*H01L 23/31* (2006.01)
*H01L 21/56* (2006.01)
*H01L 23/00* (2006.01)
*H10W 74/01* (2026.01)
*H10W 74/10* (2026.01)
(Continued)

(52) U.S. Cl.

CPC ......... *H10W 74/147* (2026.01); *H10W 74/01* (2026.01); *H10W 72/221* (2026.01); *H10W 72/242* (2026.01); *H10W 72/252* (2026.01); *H10W 72/923* (2026.01); *H10W 72/9415* (2026.01); *H10W 72/952* (2026.01); *H10W 72/953* (2026.01)

(58) Field of Classification Search

CPC . H10W 74/147; H10W 74/01; H10W 72/221; H10W 72/242; H10W 72/252; H10W 72/923; H10W 72/9415; H10W 72/952; H10W 72/953; H10W 72/90; H10W 20/031; H10W 20/033; H10W 20/0698; H10W 20/435; H10W 20/47; H01L 24/13
USPC .......................................................... 257/737
See application file for complete search history.

(56) References Cited

U.S. PATENT DOCUMENTS

2023/0352595 A1* 11/2023 Wu ...................... H10D 86/441

FOREIGN PATENT DOCUMENTS

CN 108288621 1/2021

* cited by examiner

*Primary Examiner* — Tong-Ho Kim
(74) *Attorney, Agent, or Firm* — JCIPRNET

(57) ABSTRACT

An electronic device includes a substrate, a metal composite structure, a first insulating layer, and a second insulating layer. The metal composite structure is disposed on the substrate and includes a first metal layer. The first metal layer has a first opening. The first insulating layer is disposed on the metal composite structure and has a second opening. The second insulating layer is disposed on the first insulating layer and has a third opening. In a cross section of the electronic device, the first opening has a first distance, the second opening has a second distance, and the third opening has a third distance. The second distance is greater than the third distance, and the third distance is greater than the first distance.

18 Claims, 6 Drawing Sheets

(51) Int. Cl.

| | |
|---|---|
| *H10W 72/20* | (2026.01) |
| *H10W 72/90* | (2026.01) |

ELECTRONIC DEVICE AND MANUFACTURING METHOD OF THE SAME

CROSS-REFERENCE TO RELATED APPLICATION

This application claims the priority benefit of U.S. provisional application serial no. 63/438,534, filed on Jan. 12, 2023, and China application Ser. No. 20/231,1090459.0, filed on Aug. 28, 2023. The entirety of each of the above-mentioned patent applications is hereby incorporated by reference herein and made a part of this specification.

BACKGROUND

Technical Field

The disclosure relates to an electronic device and a manufacturing method of the electronic device.

Description of Related Art

In the manufacturing process of electronic devices, metal composite structures can be provided to be applied, for example, to the bonding process of the back-end-of-line (BEOL) process. However, before the metal composite structure is subjected to an electroless plating process (such as electroless nickel immersion gold), the multi-layer insulating layer covering the metal composite structure must be etched. If the insulating layers have different materials, thicknesses, and/or other characteristics, the through hole formed after etching the insulating layers will be prone to defects and/or the etched insulating layers will be easily broken such that the reliability of the electronic devices is reduced.

SUMMARY

The disclosure provides an electronic device and a manufacturing method of the electronic device, which can reduce the likelihood of defects in a through hole formed in the electronic device and/or breakage of insulating layers, so that the reliability of the electronic device of the disclosure can be improved.

According to some embodiments of the disclosure, an electronic device includes a substrate, a metal composite structure, a first insulating layer, and a second insulating layer. The metal composite structure is disposed on the substrate and includes a first metal layer. The first metal layer has a first opening. The first insulating layer is disposed on the metal composite structure and has a second opening. The second insulating layer is disposed on the first insulating layer and has a third opening. Under a cross section of the electronic device, the first opening has a first distance, the second opening has a second distance, and the third opening has a third distance. The second distance is greater than the third distance, and the third distance is greater than the first distance.

According to some embodiments of the disclosure, a manufacturing method of an electronic device includes the following steps. A substrate is provided. A metal composite structure is formed on the substrate. The metal composite structure includes a first metal layer. A first insulating layer is formed on the metal composite structure. A first opening is formed in the first insulating layer. A second insulating layer is formed on the first insulating layer. A second opening is formed in the second insulating layer. A third opening is formed in the first metal layer. The first opening overlaps the second opening and the third opening.

In order to make the above-mentioned features and advantages of the disclosure clearer and easier to understand, the following embodiments are given and described in details with accompanying drawings as follows.

DESCRIPTION OF THE EMBODIMENTS

Figure 1:
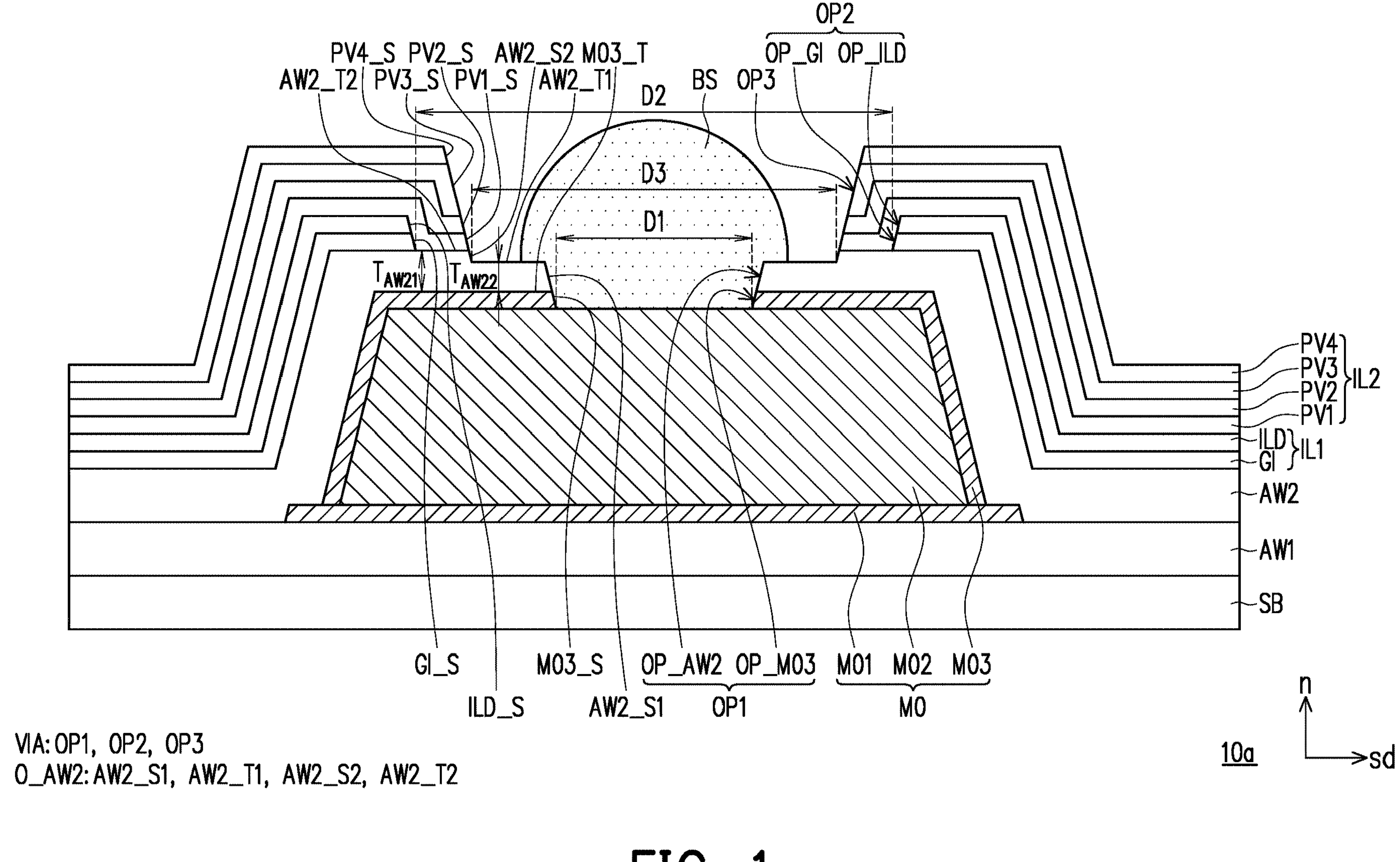
FIG. 1 is a partial cross-sectional schematic diagram of an electronic device according to a first embodiment of the disclosure.

The disclosure can be understood by referring to the following detailed description in conjunction with the drawings. It should be noted that in order to facilitate the understanding of the reader and the simplicity of the drawings, some drawings in the disclosure only depict a portion of an electronic device, and specific elements in the drawings are not drawn according to actual scale. In addition, the number and the size of each element in the drawings are for illustration only and are not intended to limit the scope of the disclosure.

Throughout the specification and the appended claims of the disclosure, certain terms are used to refer to specific elements. It should be understood by persons skilled in the art that electronic device manufacturers may refer to the same element by different names. The disclosure does not intend to distinguish between elements with the same function but different names. In the following specification and claims, words such as "including", "containing", and "having" are open-ended words, so the words should be interpreted as "comprising but not limited to . . . ". Therefore, when the terms "including", "containing", and/or "having" are used in the description of the disclosure, the words designate the presence of corresponding features, regions, steps, operations, and/or components, but do not exclude the presence of one or more corresponding features, regions, steps, operations and/or components.

Directional terms, such as "upper", "lower", "front", "rear", "left", and "right", mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or the nature covered by the embodiments. For example, the relative sizes, thicknesses, and positions of various film layers, regions, and/or structures may be reduced or enlarged for clarity.

When a corresponding component (for example, a film layer or a region) is referred to as being "disposed on another component", the component may be directly disposed on the other component, or there may be another component between the two. On the other hand, when a component is referred to as being "directly disposed on" another component, there is no component between the two. In addition, when a component is referred to as being "disposed on another component", the two have an up-down relationship in the top view direction. The component may be above or below the other component, and the up-down relationship depends on the orientation of the device.

The terms "about", "substantially", or "roughly" are generally construed as within 10% of a given value or range, or as within 5%, 3%, 2%, 1%, or 0.5% of the given value or range.

Terms such as "first" and "second" used in the specification and the claims are used to modify elements, and the terms do not imply and represent that the elements have any previous ordinal numbers, nor do they represent the order of a certain element and another element or the order of a manufacturing method. The use of the ordinal numbers is only used to clearly distinguish between an element with a certain name and another element with the same name. The claims and the specification may not use the same terms, whereby a first component in the specification may be a second component in the claims.

It should be noted that, in the following embodiments, features in several different embodiments may be replaced, recombined, and mixed to complete other embodiments without departing from the spirit of the present disclosure. As long as the features of the various embodiments do not violate the spirit of the disclosure or conflict with each other, they may be mixed and matched freely.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, other suitable elements, or a combination of the above elements between the terminals of the elements on the two circuits, but not limited thereto.

In the disclosure, the measurement manner of thickness, length, and width may adopt an optical microscope, and the thickness may be measured by a cross-sectional image in an electron microscope, but not limited thereto. In addition, there may be a certain error between any two values or directions for comparison. If a first value is equal to a second value, it implies that there may be an error of about 10% between the first value and the second value; if a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

In the disclosure, the electronic device may include an antenna device, a display device, a sensing device, a light emitting device, or a splicing device, but not limited thereto. The electronic device may be a bendable or flexible electronic device. The electronic device may include electronic components. The electronic device may include, for example, a liquid crystal layer or a light emitting diode (LED). The electronic component may include a passive component and an active component, such as a capacitor, a resistor, an inductor, a variable capacitor, a filter, a diode, a transistor, a sensor, a microelectromechanical systems (MEMS), and a liquid crystal chip, but not limited thereto. The diode may include a light emitting diode or a photodiode. The light emitting diode may include, for example, an organic light emitting diode (OLED), a mini LED, a micro LED, a quantum dot LED, fluorescence, phosphor, other suitable materials, or a combination of the above, but not limited thereto. The sensing device may include, for example, a capacitive sensor, an optical sensor, an electromagnetic sensor, a fingerprint sensor (FPS), a touch sensor, an antenna, or a pen sensor, but not limited thereto.

The following illustrates exemplary embodiments of the disclosure, wherein the same or similar parts are denoted by the same reference numerals in the drawings and descriptions.

FIG. 1 is a partial cross-sectional schematic diagram of an electronic device according to a first embodiment of the disclosure.

Referring to FIG. 1, an electronic device 10*a* of the embodiment includes a substrate SB, a metal composite structure M0, a first insulating layer IL1, and a second insulating layer IL2. It is worth noting that the electronic device 10*a* of the embodiment can include, for example, an antenna device, a display device, a sensing device, a light emitting device, or a splicing device, but the disclosure is not limited thereto. For example, the electronic device 10*a* can be an antenna device, which is suitable for communication fields, radar/lidar fields, reconfigurable intelligent surface (RIS) technologies, or other suitable fields/technologies, but the disclosure is not limited thereto. In some embodiments, the electronic device 10*a* can be a flexible electronic device, but the disclosure is not limited thereto.

The material of the substrate SB can be, for example, glass, plastic, or a combination thereof. For example, the material of the substrate SB can include quartz, sapphire, silicon (Si), germanium (Ge), silicon carbide (SiC), gallium nitride (GaN), silicon germanium (SiGe), polymethyl methacrylate (PMMA), polycarbonate (PC), polyimide (PI), polyethylene terephthalate (PET), other suitable materials, or a combination of the above materials, and the disclosure is not limited thereto.

The metal composite structure M0 is, for example, disposed on the substrate SB. In some embodiments, the metal composite structure M0 can serve as a pad portion of the electronic device 10*a*. Specifically, the metal composite structure M0 can be a pad portion used to electrically connect an external electronic component (not shown, which can be a chip, for example) to an active component (not shown), but the disclosure is not limited thereto. In some embodiments, the metal composite structure M0 can, for example, belong to the same layer with a ground layer (not shown), an electrostatic protection layer (not shown), an electromagnetic interference shielding layer (not shown), a heat dissipation layer (not shown), or other layers with other purposes included in the electronic device 10*a*, but the disclosure is not limited thereto. In some embodiments, the material of the metal composite structure M0 can include low-impedance materials such as copper, titanium, silver, gold, aluminum, tin, nickel, or a combination thereof. However, the material of the metal composite structure M0 can also be, for example, other suitable materials or a combination of the above materials, and the disclosure is not limited thereto. Additionally, in some embodiments, the metal composite structure M0 includes a stacked structure stacked with each other. In the embodiment, the metal composite structure M0 has a metal layer M01, a metal layer M02, and a metal layer M03 stacked in such an order in a normal direction n of the substrate SB. That is, the metal layer M02 is disposed between the metal layer M03 and the substrate SB, and the metal layer M01 is disposed between the metal layer M02 and the substrate SB. In the embodiment, the metal layer M03 has an opening OP_M03 to expose at least part of the metal layer M02, so that the metal layer M02 can contact an electrical connection structure BS which will be introduced later and be electrically connected to each other, but the disclosure is not limited thereto. In some embodiments, the material of the metal layer M01 can include titanium, titanium alloy, molybdenum, molybdenum alloy (such as molybdenum titanium alloy, molybdenum tantalum alloy, molybdenum niobium alloy), indium tin oxide, indium zinc oxide, or a combination thereof, and the material of the metal layer M02 includes copper, aluminum, or a combination thereof, and the material of metal layer M03 includes titanium, titanium alloy, molybdenum, molybdenum alloy (such as molybdenum titanium alloy, molybdenum tantalum alloy, molybdenum niobium alloy), indium tin oxide, indium zinc oxide, or a combination thereof, but the disclosure is not limited thereto.

In the embodiment, the electronic device 10*a* further includes an anti-warp layer AW1. The anti-warp layer AW1 is, for example, disposed between the substrate SB and the metal composite structure M0. In some embodiments, the material of the anti-warp layer AW1 can be silicon oxide, silicon nitride, silicon oxynitride, or a combination thereof, but the disclosure is not limited thereto. The anti-warp layer AW1 can, for example, be selected from a material including an appropriate thermal expansion coefficient; or a material that is opposite to the stress generated when the metal composite structure M0 undergoes the heating process; or a material with good adhesion to the metal composite structure M0. Based on the above, the anti-warp layer AW1 can have a stress control effect, thereby reducing the possibility of substrate warpage. In detail, since the material included in the metal composite structure M0 has a thermal expansion coefficient greater than a thermal expansion coefficient of the material of the substrate SB, in the process of forming the electronic device 10*a*, the metal composite structure M0 may undergo multiple heating processes and be subjected to thermal stress such that an edge of the substrate SB have a tendency to warp toward the direction facing the metal composite structure M0. In this regard, the disposition of the anti-warp layer AW1 can reduce the influence of thermal stress on the metal composite structure M0, so as to reduce the warpage phenomenon generated in the substrate SB.

In the embodiment, the electronic device 10*a* further includes an anti-warp layer AW2. The anti-warp layer AW2 is, for example, disposed on the metal composite structure M0. In some embodiments, the material of the anti-warp layer AW2 can be silicon oxide, silicon nitride, silicon oxynitride, or a combination thereof, but the disclosure is not limited thereto. The anti-warp layer AW2 can, for example, be similar to the anti-warp layer AW1 and can also reduce the warpage phenomenon generated in the substrate SB, and will not be repeated again.

In the embodiment, the anti-warp layer AW2 has a stepped profile O_AW2. In detail, the anti-warp layer AW2 includes a side surface AW2_S1, a top surface AW2_T1, a side surface AW2_S2, and a top surface AW2_T2. The top surface AW2_T1 is connected to the side surface AW2_S1, the side surface AW2_S2 is connected to the top surface AW2_T1, and the top surface AW2_T2 is connected to the side surface AW2_S2 to form the profile O_AW2 of the anti-warp layer AW2. In some embodiments, the anti-warp layer AW2 with the stepped profile O_AW2 has different thicknesses. In detail, the anti-warp layer AW2 can have, for example, a thickness $T_{AW21}$ and a thickness $T_{AW22}$. The thickness $T_{AW21}$ is, for example, the distance between a top surface M03_T of the metal layer M03 and the top surface AW2_T2 of the anti-warp layer AW2 in the normal direction n of the substrate SB, and the thickness $T_{AW22}$ is, for example, the distance between the top surface M03_T of the metal layer M03 and the top surface AW2_T1 of the anti-warp layer AW2 in the normal direction n of the substrate SB. Therefore, in the embodiment, the thickness $T_{AW21}$ is greater than the thickness $T_{AW22}$. In some embodiments, the relationship between the thickness $T_{AW21}$ and the thickness $T_{AW22}$ conforms to the following relationship: $0.1 \leq T_{AW22}/T_{AW21} < 1.0$.

In the embodiment, the anti-warp layer AW2 has an opening OP_AW2. The opening OP_AW2 of the anti-warp layer AW2 is communicated with the opening OP_M03 of the metal layer M03 to form an opening OP1 to expose at least part of the metal layer M02, but the disclosure is not limited thereto. In the embodiment, the outline of the opening OP1 can be defined by the side surface AW2_S1 of the anti-warp layer AW2 and a side surface M03_S of the metal layer M03. The side surface AW2_S1 is connected to the side surface M03_S, but the disclosure is not limited thereto.

The first insulating layer IL1 is, for example, disposed on the metal composite structure M0 and exposes a part of the metal composite structure M0. In the embodiment, the first insulating layer IL1 is disposed on the anti-warp layer AW2 and has an opening OP2, and the opening OP2 exposes the metal layer M02 in the metal composite structure M0. In detail, the opening OP2 can be, for example, overlapped and communicated with the opening OP1 to expose at least part of the metal layer M02, but the disclosure is not limited thereto. The material of the first insulating layer IL1 can be, for example, an inorganic material (such as silicon oxide, silicon nitride, silicon oxynitride, or a stacked layer of at least two of the above materials), an organic material (such as a polyimide resin, epoxy resin, or acrylic resin), or a combination of the above. In the embodiment, the material of the first insulating layer IL1 includes silicon oxide, but the disclosure is not limited thereto. In some embodiments, the first insulating layer IL1 can be a single-layer structure or a multi-layer structure. In the embodiment, the first insulating layer IL1 includes a multi-layer structure. In detail, the first insulating layer IL1 can, for example, have an insulating sub-layer GI and an insulating sub-layer ILD stacked in such an order in the normal direction n of the substrate SB. The insulating sub-layer GI and the insulating sub-layer ILD can be used, for example, in the electronic device 10*a* to separate the gate (not shown) and the semiconductor layer (not shown) and to separate the gate and the source/drain (not shown), but the disclosure is not limited thereto. In some embodiments, the electronic device 10*a* can further include a buffer layer (not shown) disposed between the insulating sub-layer GI and the anti-warp layer AW2, but the disclosure is not limited thereto.

In the embodiment, the outline of the opening OP2 can be defined by a side surface GI_S of the insulating sub-layer GI and a side surface ILD_S of the insulating sub-layer ILD. The side surface GI_S is connected to the side surface ILD_S, but the disclosure is not limited thereto.

The second insulating layer IL2 is, for example, disposed on the first insulating layer IL1 and exposes a part of the metal composite structure M0. In the embodiment, the second insulating layer IL2 covers the first insulating layer IL1 and has an opening OP3, and the opening OP3 exposes the metal layer M02 in the metal composite structure M0. In detail, the opening OP3 can be, for example, overlapped and communicated with the opening OP2 and the opening OP1 to expose at least part of the metal layer M02, but the disclosure is not limited thereto. The material of the second insulating layer IL2 can be, for example, an inorganic material (such as silicon oxide, silicon nitride, silicon oxynitride, or a stacked layer of at least two of the above materials), an organic material (such as a polyimide resin, epoxy resin, or acrylic resin), or a combination of the above. In the embodiment, the material of the second insulating layer IL2 includes silicon nitride, but the disclosure is not limited thereto. In some embodiments, the second insulating layer IL2 can be a single-layer structure or a multi-layer structure. In the embodiment, the second insulating layer IL2 includes a multi-layer structure. In detail, the second insulating layer IL2 can, for example, have an insulating sub-layer PV1, an insulating sub-layer PV2, an insulating sub-layer PV3, and an insulating sub-layer PV4 stacked in such an order in the normal direction n of the substrate SB, which can be used, for example, in the electronic device 10*a* to separate at least two conductive layers, but the disclosure is not limited thereto.

The thickness of the insulating sub-layer PV1 can be 500 Å to 4000 Å (500 Å≤ the thickness of the insulating sub-layer PV1≤4000 Å), for example, 800 Å, 1100 Å, 1500 Å, 1900 Å, 2300 Å, or 2700 Å. The thickness of the insulating sub-layer PV2 can be 500 Å to 4000 Å (500 Å≤ the thickness of the insulating sub-layer PV2≤4000 Å), for example, 800 Å, 1100 Å, 1500 Å, 1900 Å, 2300 Å, or 2700 Å. The thickness of the insulating sub-layer PV3 can be 500 Å to 4000 Å (500 Å≤ the thickness of the insulating sub-layer PV3≤4000 Å), for example, 800 Å, 1100 Å, 1500 Å, 1900 Å, 2300 Å, or 2700 Å. The thickness of insulating sub-layer PV4 can be 500 Å to 4000 Å (500 Å≤ the thickness of the insulating sub-layer PV4≤4000 Å), for example, 2500 Å, 3000 Å, 3500 Å, or 3900 Å, but the disclosure is not limited thereto. In some embodiments, the thickness of the insulating sub-layer PV4 is greater than the thickness of the insulating sub-layer PV1, but the disclosure is not limited thereto. In other embodiments, the thickness of the insulating sub-layer PV4 is greater than the thickness of the insulating sub-layer PV2, but the disclosure is not limited thereto.

In the embodiment, the outline of the opening OP3 can be defined by the side surface AW2_S2 of the anti-warp layer AW2, a side surface PV1_S of the insulating sub-layer PV1, a side surface PV2_S of the insulating sub-layer PV2, a side surface PV3_S of the insulating sub-layer PV3, and a side surface PV4_S of the insulating sub-layer PV4. The side surface AW2_S2 is connected to the side surface PV1_S, the side surface PV1_S is connected to the side surface PV2_S, the side surface PV2_S is connected to the side surface PV3_S, and the side surface PV3_S is connected to the side surface PV4_S, but the disclosure is not limited thereto.

In the embodiment, the opening OP1 overlaps the opening OP2 and the opening OP3, and the opening OP1, the opening OP2, and the opening OP3 are communicated with each other to form a through hole VIA to expose part of the metal composite structure M0. In the embodiment, in a cross section of the electronic device 10*a* (or a specific direction sd perpendicular to the normal direction n of the substrate SB), the opening OP1 has a distance D1, the opening OP2 has a distance D2, and the opening OP3 has a distance D3. The distance D2 is greater than the distance D3, and the distance D3 is greater than the distance D1.

In the embodiment, the electronic device 10*a* further includes an electrical connection structure BS. The electrical connection structure BS is, for example, disposed on the metal composite structure M0. In the embodiment, the electrical connection structure BS is disposed in the through hole VIA and at least disposed in the opening OP1, and is electrically connected to the metal composite structure M0 through the through hole VIA. In some embodiments, the electrical connection structure BS can include a combination of solder and bumps. Specifically, in the embodiment, the electrical connector can include electroless nickel immersion gold (ENIG), but the disclosure is not limited thereto. In other embodiments, the electrical connection structure BS can include such structures as solder balls or conductive pillars, and the material thereof can include metal or alloy.

Based on the above, in the electronic device 10*a* of the embodiment, the through hole VIA includes the opening OP1, the opening OP2, and the opening OP3 with different distances from each other and has a stepped outline such that the likelihood of defects in the formed through hole VIA and/or breakage of insulating layers (including the aforementioned insulating layers) can be reduced to reduce the electrical connection defects between the electrical connection structure BS disposed in the through hole VIA and the metal composite structure M0, thereby improving the reliability of the electronic device 10*a* of the disclosure.

Figure 2:
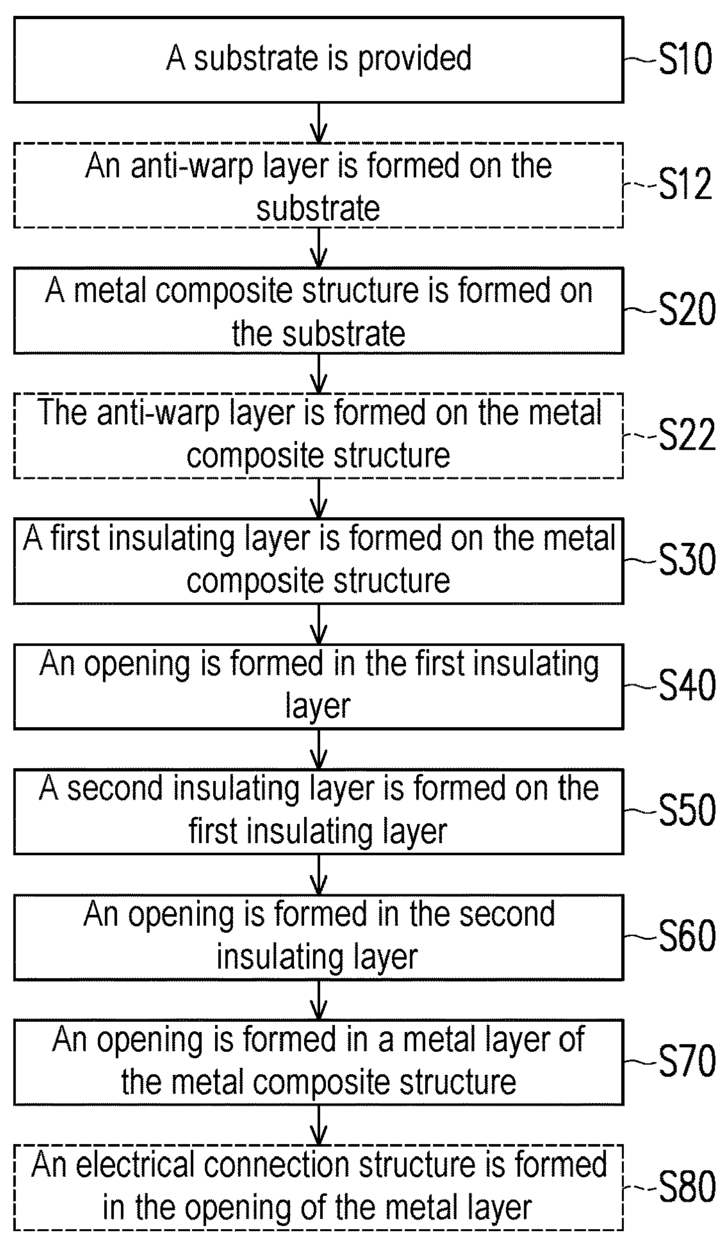
FIG. 2 is a flow chart of a manufacturing method of an electronic device according to the first embodiment of the disclosure.

FIG. 2 is a flow chart of a manufacturing method of an electronic device according to the first embodiment of the disclosure. It should be noted that the embodiment of FIG. 2 can continue to use the reference numerals of the components and a part of the contents of the embodiments of FIG. 1, wherein the same or similar components are denoted by the same or similar reference numerals, and the description of the same technical content is omitted.

Referring to FIG. 2, step S10 is performed to provide a substrate SB. For the material included in the substrate SB, reference can be made to the foregoing embodiments and will not be repeated here.

Step S20 is performed to form a metal composite structure M0 on the substrate SB. In the embodiment, the metal composite structure M0 includes a metal layer M01, a metal layer M02, and a metal layer M03. The metal composite structure M0 can be formed on the substrate SB by, for example, physical vapor deposition, metal chemical vapor deposition, or other suitable processes, and the disclosure is not limited thereto. For the material included in the metal composite structure M0 and the structure thereof, reference can be made to the foregoing embodiments and will not be repeated here.

In some embodiments, before step S20 is performed, step S12 can be optionally performed to form an anti-warp layer AW1 on the substrate SB. The anti-warp layer AW1 can be formed on the substrate SB by, for example, chemical vapor deposition or other suitable processes, and the disclosure is not limited thereto. For the material included in the anti-warp layer AW1, reference can be made to the foregoing embodiments and will not be repeated here.

Step S30 is performed to form an first insulating layer IL1 on the metal composite structure M0. The first insulating layer IL1 can be formed on the metal composite structure M0 by, for example, chemical vapor deposition or other suitable processes, and the disclosure is not limited thereto. In the embodiment, the first insulating layer IL1 has a two-layer stacked structure, but the disclosure is not limited thereto. For the material included in the first insulating layer IL1 and the structure thereof, reference can be made to the foregoing embodiments and will not be repeated here.

In some embodiments, before step S30 is performed, step S22 can be optionally performed to form an anti-warp layer AW2 on the metal composite structure M0. The anti-warp layer AW2 can be formed on the substrate SB by, for example, chemical vapor deposition or other suitable processes, and the disclosure is not limited thereto. For the material included in the anti-warp layer AW2 and the structure thereof, reference can be made to the foregoing embodiments and will not be repeated here.

Step S40 is performed to form an opening OP2 in the first insulating layer IL1. The opening OP2 is formed, for example, by performing a photolithography process and an etching process. For example, a plurality of photoresist patterns (not shown) can be formed on the first insulating layer IL1 first, and then the photoresist patterns are used as masks to remove part of the first insulating layer IL1 to form the first insulating layer IL1 including the opening OP2.

Step S50 is performed to form a second insulating layer IL2 on the first insulating layer IL1. The second insulating layer IL2 can be formed on the first insulating layer IL1 by, for example, chemical vapor deposition or other suitable processes, and the disclosure is not limited thereto. In the embodiment, the second insulating layer IL2 has a four-layer stacked structure, but the disclosure is not limited thereto. For the material included in the second insulating layer IL2 and the structure thereof, reference can be made to the foregoing embodiments and will not be repeated here.

Step S60 is performed to form an opening OP3 in the second insulating layer IL2. The opening OP3 is formed, for example, by performing a photolithography process and an etching process. For example, a plurality of photoresist patterns (not shown) can be formed on the second insulating layer IL2 first, and then the photoresist patterns are used as masks to remove part of the second insulating layer IL2 to form the second insulating layer IL2 including the opening OP3. It is worth noting that in the step of forming the opening OP3 in the second insulating layer IL2, a part of the anti-warp layer AW2 can be removed, so that the anti-warp layer AW2 has a stepped profile O_AW2.

Step S70 is performed to form an opening OP1 in the metal layer M03 of the metal composite structure M0. The opening OP1 is formed, for example, by performing a photolithography process and an etching process. For example, a plurality of photoresist patterns (not shown) can be formed on the second insulating layer IL2 and the anti-warp layer AW2 first, and then the photoresist patterns are used as masks to remove part of the anti-warp layer AW2 and the metal layer M03 to form the metal layer M03 including the opening OP1.

In the embodiment, the opening OP2 of the first insulating layer IL1 overlaps the opening OP3 of the second insulating layer IL2 and the opening OP1 of the metal layer M03, and the opening OP1, the opening OP2, and the opening OP3 are communicated with each other to form a through hole VIA.

Afterwards, step S80 can be optionally performed to form an electrical connection structure BS in the opening OP1 (through hole VIA) of the metal layer M03. The electrical connection structure BS can be formed, for example, through an electroless plating process. In the embodiment, the electrical connection structure BS is formed by electroless nickel immersion gold technology, but the disclosure is not limited thereto. For the material included in the electrical connection structure BS and the structure thereof, reference can be made to the foregoing embodiments and will not be repeated here.

In some embodiments, after the electrical connection structure BS is formed in the opening OP1 (through hole VIA) of the metal layer M03, an external electronic component (not shown) can be provided on the electrical connection structure BS, so that the external electronic component and the metal composite structure M0 can be electrically connected. It is worth noting that the embodiment does not limit the type and function of the external electronic component.

Figure 3:
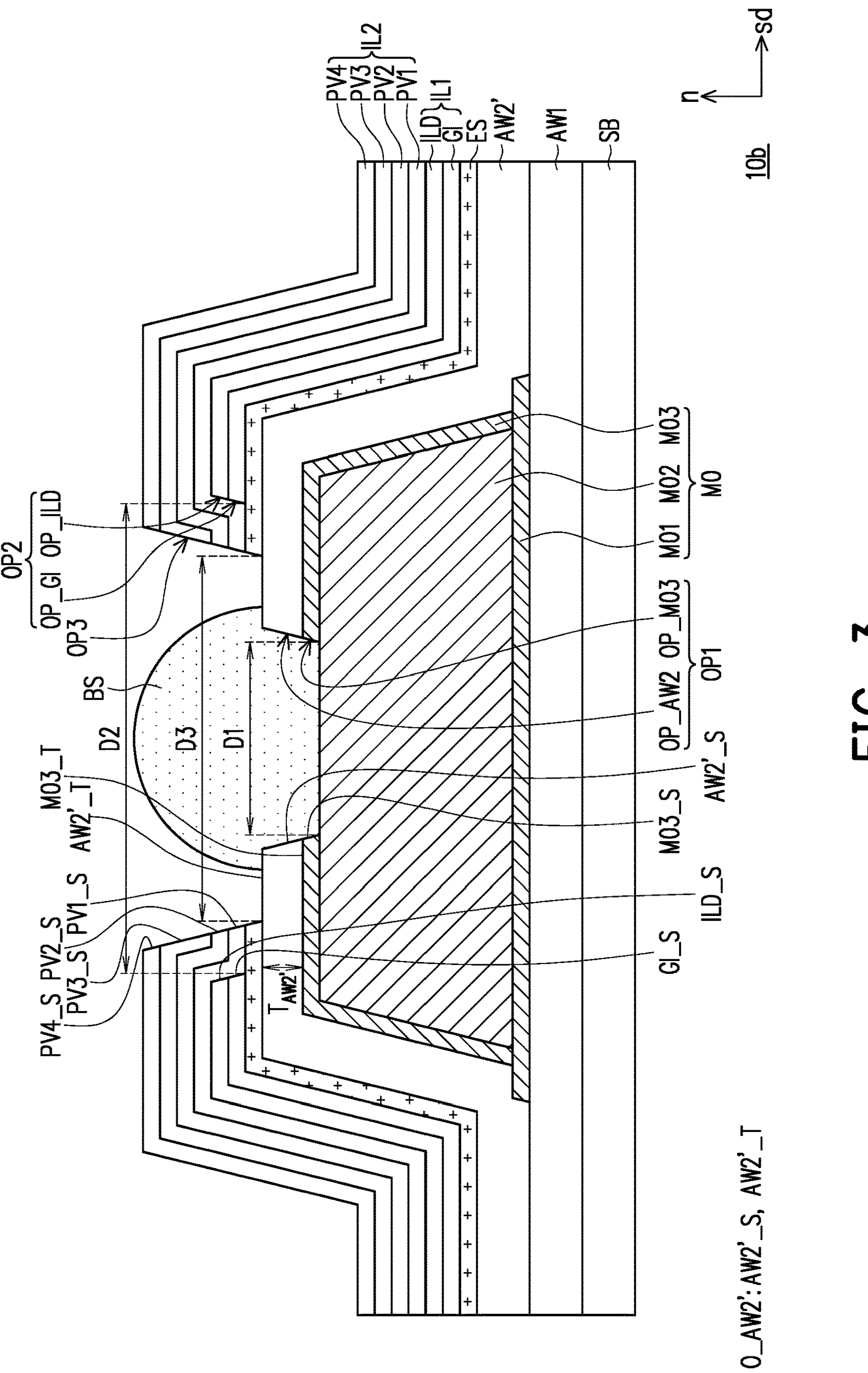
FIG. 3 is a partial cross-sectional schematic diagram of an electronic device according to a second embodiment of the disclosure.

FIG. 3 is a partial cross-sectional schematic diagram of an electronic device according to a second embodiment of the disclosure. It should be noted that the embodiment of FIG. 3 can continue to use the reference numerals of the components and a part of the contents of the embodiments of FIG. 1, wherein the same or similar components are denoted by the same or similar reference numerals, and the description of the same technical content is omitted.

Referring to FIG. 3, the main difference between an electronic device 10*b* of the embodiment and the aforementioned electronic device 10*a* is that the electronic device 10*b* further includes an etching stop layer ES.

The etching stop layer ES is, for example, disposed between the metal composite structure M0 and the first insulating layer IL1. In some embodiments, the etching stop layer ES can be used as a light shielding layer in the electronic device 10*b*. Based on the above, the material of the etching stop layer ES can include a material with a transmittance lower than 30%, but the disclosure is not limited thereto.

In the embodiment, the etching stop layer ES can be applied in the process of forming the opening OP2 of the first insulating layer IL1. Based on the above, the etching stop layer ES can reduce the likelihood of removing an anti-warp layer AW2' or removing an excessive anti-warp layer AW2' when forming the opening OP2, so that the likelihood of defects in the first insulating layer IL1 and/or the anti-warp layer AW2' can be reduced due to the removal of more layers of insulating layers in a process.

Furthermore, the etching stop layer ES can also be applied, for example, in the process of forming the opening OP3 of the second insulating layer IL2. That is, the etching stop layer ES can reduce the likelihood of removing an anti-warp layer AW2' or removing an excessive anti-warp layer AW2' when forming the opening OP3 to further prevent the metal composite structure M0 from being partially removed during the process of forming the opening OP3, thereby increasing the reliability of the electronic device 10*b*.

In addition, through the disposition of the etching stop layer ES, the anti-warp layer AW2' in the electronic device 10*b* of the embodiment will not be partially removed in the process of forming the opening OP3 and can have substantially the same thickness TAW2'. That is, the thickness TAW2' of the anti-warp layer AW2' in the electronic device 10*b* can be substantially the same as the thickness TAW21 of the anti-warp layer AW2 in the electronic device 10*a*. Based on the above, in the embodiment, the anti-warp layer AW2' has a profile O_AW2' defined by the top surface AW2'_T and the side surface AW2'_S. The top surface AW2'_T is connected to the side surface AW2'_S, but the disclosure is not limited thereto. In other embodiments, the anti-warp layer AW2' can also be partially removed during the process of forming the opening OP3.

Figure 4:
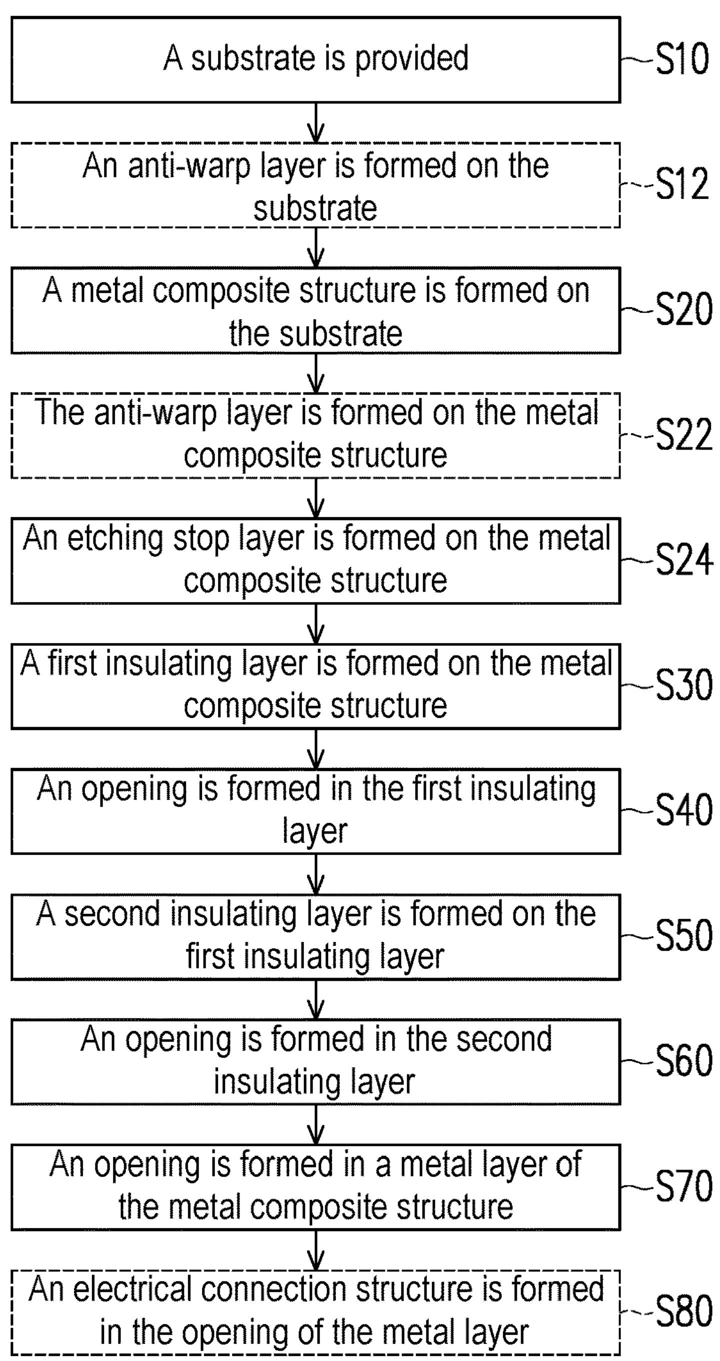
FIG. 4 is a flow chart of a manufacturing method of an electronic device according to the second embodiment of the disclosure.

FIG. 4 is a flow chart of a manufacturing method of an electronic device according to the second embodiment of the disclosure. It should be noted that the embodiment of FIG. 4 can continue to use the reference numerals of the components and a part of the contents of the embodiments of FIG. 2 and FIG. 3, wherein the same or similar components are denoted by the same or similar reference numerals, and the description of the same technical content is omitted.

Referring to FIG. 4, the main difference between the manufacturing method of the electronic device 10*b* of the embodiment and the aforementioned manufacturing method of the electronic device 10*a* is that step S24 is also performed to form an etching stop layer ES on the metal composite structure M0. The etching stop layer ES can be located between the metal composite structure M0 and the first insulating layer IL1.

In the embodiment, step S24 is performed between step S22 and step S30. The etching stop layer ES can be formed on the substrate SB by, for example, physical vapor deposition or other suitable processes, and the disclosure is not limited thereto. For the material included in the etching stop layer ES and the use thereof, reference can be made to the foregoing embodiments and will not be repeated here.

Figure 5:
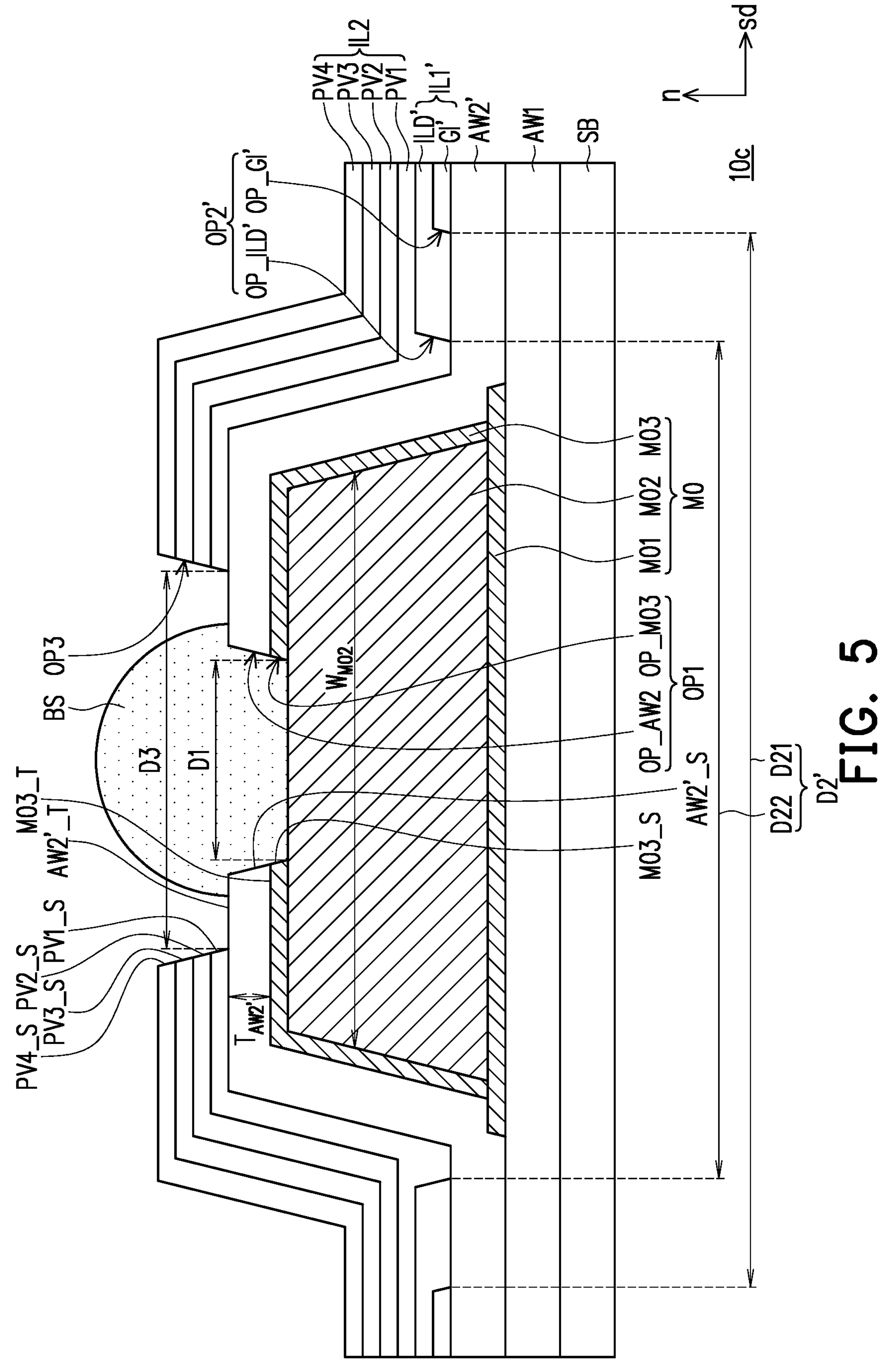
FIG. 5 is a partial cross-sectional schematic diagram of an electronic device according to a third embodiment of the disclosure.

FIG. 5 is a partial cross-sectional schematic diagram of an electronic device according to a third embodiment of the disclosure. It should be noted that the embodiment of FIG. 5 can continue to use the reference numerals of the components and a part of the contents of the embodiments of FIG. 1, wherein the same or similar components are denoted by the same or similar reference numerals, and the description of the same technical content is omitted.

Referring to FIG. 5, the main difference between an electronic device 10*c* of the embodiment and the aforementioned electronic device 10*a* is that a distance D2' of an opening OP2' of a first insulating layer IL1' is greater than a width $W_{M02}$ of the metal layer M02.

In detail, in the embodiment, the first insulating layer IL1' is not disposed on the metal layer M03 and exposes the metal layer M02 in the normal direction n of the substrate SB. Therefore, the distance D2' of the opening OP2' of the first insulating layer IL1' in the specific direction sd can be greater than the width $W_{M02}$ of the metal layer M02 in the specific direction sd.

In addition, in the embodiment, the insulating sub-layer in the first insulating layer IL1' includes openings with different distances in the specific direction sd. As shown in FIG. 5, a first distance D21 in the specific direction sd of an opening OP_GI' of an insulating sub-layer GI' in the first insulating layer IL1' and a second distance D22 in the specific direction sd of an opening OP_ILD' of an insulating sub-layer ILD' in the first insulating layer IL1' are different. In the embodiment, the insulating sub-layer GI' is covered by the insulating sub-layer ILD'. Therefore, the first distance D21 can be greater than the second distance D22, but the disclosure is not limited thereto.

Figure 6:
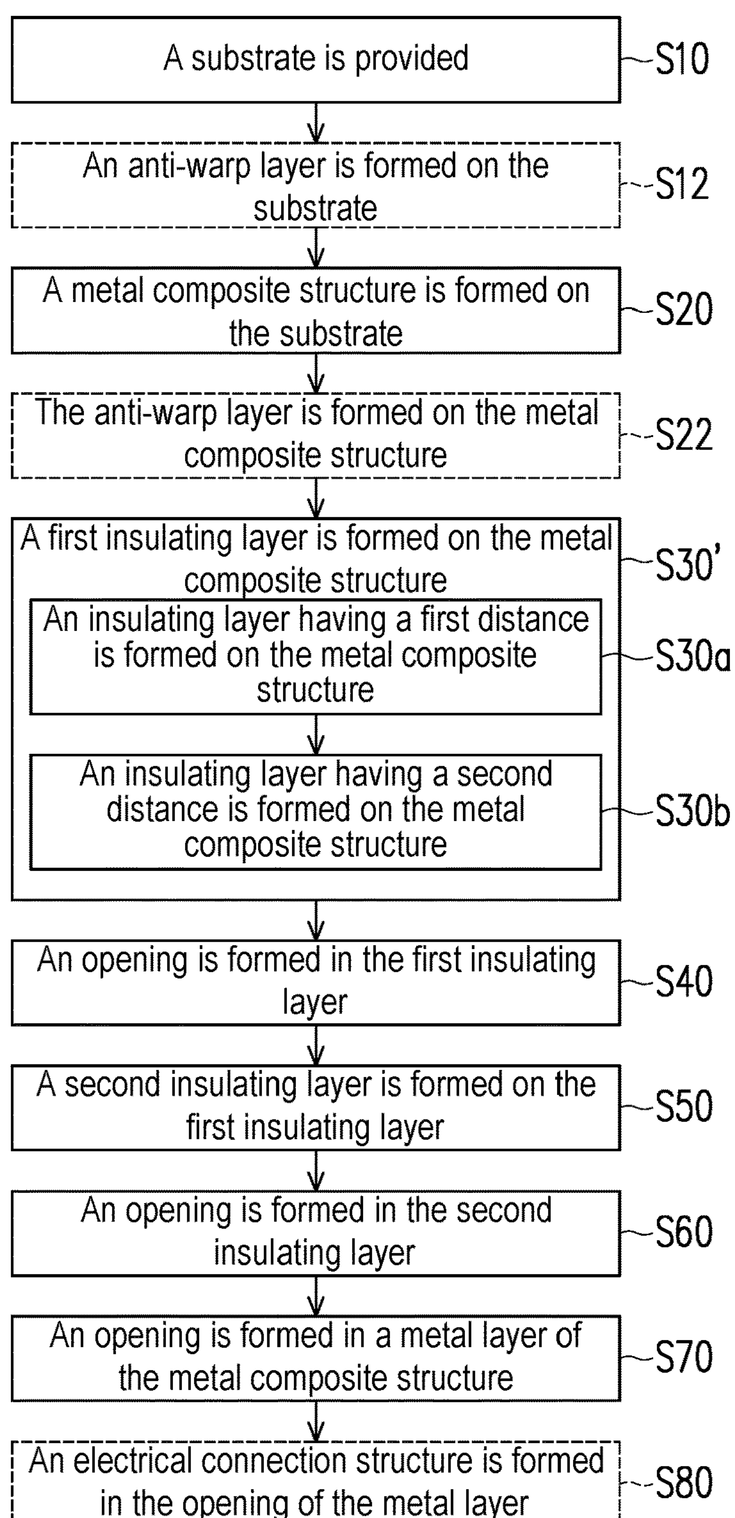
FIG. 6 is a flow chart of a manufacturing method of an electronic device according to the third embodiment of the disclosure.

FIG. 6 is a flow chart of a manufacturing method of an electronic device according to the third embodiment of the disclosure. It should be noted that the embodiment of FIG. 6 can continue to use the reference numerals of the components and a part of the contents of the embodiments of FIG. 2 and FIG. 5, wherein the same or similar components are denoted by the same or similar reference numerals, and the description of the same technical content is omitted.

Referring to FIG. 6, the main difference between the manufacturing method of the electronic device 10*c* of the embodiment and the aforementioned manufacturing method of the electronic device 10*a* is that step S30' is performed to form the first insulating layer IL1 and includes step S30*a* and step S30*b*.

Specifically, in the embodiment, step S30*a* is performed to form an insulating sub-layer GI' with a first distance D21 on the metal composite structure M0. The insulating sub-layer GI' can be formed by, for example, first using a chemical vapor deposition method or other suitable processes to form an insulating material sub-layer (not shown) on the metal composite structure M0, and then performing a photolithography process and an etching process on the insulating material sub-layer to form the insulating sub-layer GI' including an opening OP_GI', but the disclosure is not limited thereto. For the material included in the insulating sub-layer GI' and the structure thereof, reference can be made to the foregoing embodiments and will not be repeated here.

Next, step S30*b* is performed to form an insulating sub-layer ILD' with a second distance D22 on the metal composite structure M0. The insulating sub-layer ILD' can be formed by, for example, first using a chemical vapor deposition method or other suitable processes to form an insulating material sub-layer (not shown) on the metal composite structure M0, and then performing a photolithography process and an etching process on the insulating material sub-layer to form the insulating sub-layer ILD' including an opening OP_ILD', but the disclosure is not limited thereto. For the material included in the insulating sub-layer ILD' and the structure thereof, reference can be made to the foregoing embodiments and will not be repeated here.

In summary, in the electronic device and the manufacturing method thereof according to some embodiments of the disclosure, the through hole used for joining the electrical connection structure and the metal composite structure can have a stepped profile, for example, by performing multiple etching processes, whereby it can reduce the likelihood of defects in the formed through hole and/or breakage of etched insulating layers, thereby improving the reliability of the electronic device of the disclosure.

What is claimed is:

1. An electronic device, comprising:

a substrate;

a metal composite structure, disposed on the substrate, and comprising a first metal layer, wherein the first metal layer has a first opening;

a first insulating layer, disposed on the metal composite structure, and having a second opening; and a second insulating layer, disposed on the first insulating layer, and having a third opening, wherein, in a cross section of the electronic device, the first opening has a first distance, the second opening has a second distance, the third opening has a third distance, the second distance is greater than the third distance, and the third distance is greater than the first distance, wherein the metal composite structure further comprises a second metal layer and a third metal layer, the second metal layer is disposed between the first metal layer and the substrate, the third metal layer is disposed between the second metal layer and the substrate, and the first metal layer exposes at least part of the second metal layer, wherein the second distance of the second opening is greater than a width of the second metal layer in the cross section of the electronic device.

2. The electronic device according to claim 1, further comprising:

an etching stop layer, disposed between the metal composite structure and the first insulating layer.

3. The electronic device according to claim 2, further comprising:

a first anti-warp layer, disposed between the substrate and the metal composite structure; and a second anti-warp layer, disposed between the metal composite structure and the first insulating layer, wherein the second anti-warp layer comprises a first top surface covered by the etching stop layer and a second top surface exposed by the etching stop layer.

4. The electronic device according to claim 3, wherein the second anti-warp layer has a first thickness and a second thickness, the first thickness is a distance between a top surface of the first metal layer and the first top surface of the second anti-warp layer in a normal direction of the substrate, the second thickness is a distance between the top surface of the first metal layer and the second top surface of the second anti-warp layer in the normal direction of the substrate, and the first thickness is equal to the second thickness.

5. The electronic device according to claim 1, further comprising an electrical connection structure, wherein the electrical connection structure is disposed in the first opening, and the electrical connection structure comprises electroless nickel immersion gold (ENIG).

6. The electronic device according to claim 1, wherein the second insulating layer comprises:

a first insulating sub-layer, disposed on the first insulating layer; and a second insulating sub-layer, disposed on the first insulating sub-layer, wherein a thickness of the second insulating sub-layer is greater than a thickness of the first insulating sub-layer.

7. The electronic device according to claim 6, wherein the thickness of the first insulating sub-layer is 500 Å to 4000 Å, and the thickness of the second insulating sub-layer is 500 Å to 4000 Å.

8. The electronic device according to claim 6, wherein the second insulating layer further comprises:

a third insulating sub-layer, disposed between the first insulating sub-layer and the second insulating sub-layer, wherein the thickness of the second insulating sub-layer is greater than a thickness of the third insulating sub-layer.

9. The electronic device according to claim 8, wherein the thickness of the third insulating sub-layer is 500 Å to 4000 Å.

10. The electronic device according to claim 1, wherein the first insulating layer and the second insulating layer comprise a multi-layer structure.

11. The electronic device according to claim 1, further comprising:

a first anti-warp layer, disposed between the substrate and the metal composite structure; and a second anti-warp layer, disposed between the metal composite structure and the first insulating layer, wherein the second anti-warp layer comprises a first top surface covered by the second insulating layer and a second top surface exposed by the second insulating layer.

12. The electronic device according to claim 11, wherein the second anti-warp layer has a first thickness and a second thickness, the first thickness is a distance between a top surface of the first metal layer and the first top surface of the second anti-warp layer in a normal direction of the substrate, the second thickness is a distance between the top surface of the first metal layer and the second top surface of the second anti-warp layer in the normal direction of the substrate, and the first thickness is greater than or equal to the second thickness.

13. The electronic device according to claim 12, wherein a relationship between the first thickness and the second thickness conforms to the following relationship: $0.1 \leq T_{AW22}/T_{AW21} < 1.0$, $T_{AW21}$ is the first thickness, and $T_{AW22}$ is the second thickness.

14. The electronic device according to claim 1, wherein the first opening, the second opening, and the third opening are communicated with each other to form a through hole, and the through hole has a stepped profile.

15. A manufacturing method of an electronic device, comprising:

providing a substrate;

forming a metal composite structure on the substrate, wherein the metal composite structure comprises a first metal layer;

forming a first insulating layer on the metal composite structure;

forming a first opening in the first insulating layer;

forming a second insulating layer on the first insulating layer;

forming a second opening in the second insulating layer; and forming a third opening in the first metal layer, wherein the first opening overlaps the second opening and the third opening, wherein the metal composite structure further comprises a second metal layer and a third metal layer, the second metal layer is disposed between the first metal layer and the substrate, the third metal layer is disposed between the second metal layer and the substrate, and the first metal layer exposes at least part of the second metal layer, wherein the second distance of the second opening is greater than a width of the second metal layer in the cross section of the electronic device.

16. The manufacturing method of the electronic device according to claim 15, further comprising:

forming an etching stop layer between the metal composite structure and the first insulating layer.

17. The manufacturing method of the electronic device according to claim 15, further comprising:

forming an electrical connection structure in the third opening of the first metal layer.

18. The manufacturing method of the electronic device according to claim 17, wherein the electrical connection structure is formed by an electroless nickel immersion gold process.

* * * * *